(12) United States Patent
Julicher et al.

(10) Patent No.: US 7,219,246 B2
(45) Date of Patent: May 15, 2007

(54) DIGITAL SYSTEM HAVING SELECTABLE CLOCK SPEED BASED UPON AVAILABLE SUPPLY VOLTAGE AND PLL CONFIGURATION REGISTER SETTINGS

(75) Inventors: Joseph Julicher, Chandler, AZ (US); David L. Otten, Chandler, AZ (US); Daniel William Butler, Chandler, AZ (US)

(73) Assignee: Microchip Technology Inc., Chandler, AZ (US)

( * ) Notice: Subject to any disclaimer, the term of this patent is extended or adjusted under 35 U.S.C. 154(b) by 339 days.

(21) Appl. No.: 10/986,254

(22) Filed: Nov. 10, 2004

(65) Prior Publication Data

US 2005/0268129 A1 Dec. 1, 2005

Related U.S. Application Data

(60) Provisional application No. 60/574,564, filed on May 26, 2004.

(51) Int. Cl.
*G06F 1/26* (2006.01)
(52) U.S. Cl. .................. 713/322; 713/600
(58) Field of Classification Search ............ 713/322, 713/600
See application file for complete search history.

(56) References Cited

U.S. PATENT DOCUMENTS 6,515,530 B1 * 2/2003 Boerstler et al. .......... 327/291
6,828,848 B2 * 12/2004 Lee ........................... 327/534
2004/0017234 A1 1/2004 Tam et al. ................. 327/141
2004/0057324 A1 3/2004 Abe et al. .................. 365/232

FOREIGN PATENT DOCUMENTS

| DE | 10063147 | 12/2000 |
|----|----------|---------|
| EP | 0704976  | 4/1996  |
| EP | 1306740  | 5/2003  |

OTHER PUBLICATIONS

PCT International Search Report and Written Opinion; PCT/US2005/018646; 13 Pgs.

* cited by examiner

*Primary Examiner*—Chun Cao
*Assistant Examiner*—Albert Wang
(74) *Attorney, Agent, or Firm*—Baker Botts L.L.P.

(57) ABSTRACT

Clock speed is controlled based upon the supply voltage to a digital device. When the supply voltage is below a reference voltage the clock speed will be slower than if the supply voltage is above the reference voltage. A phase-lock-loop (PLL) may be used to generate a higher frequency that is an integer multiple of a reference oscillator. The clock speed will be proportional to the frequency multiplication of the PLL when the faster clock speed is selected. A multiplexer is used to switch between different frequency sources, and a timer can be used to insure stable operation of the PLL. A status configuration register has status and control bits for indicating and controlling operation of the clock speed control. A universal serial bus (USB) device can operate at a slower clock with reduced operating voltage, and at a faster clock with increased operating voltage.

11 Claims, 2 Drawing Sheets

US 7,219,246 B2

DIGITAL SYSTEM HAVING SELECTABLE CLOCK SPEED BASED UPON AVAILABLE SUPPLY VOLTAGE AND PLL CONFIGURATION REGISTER SETTINGS

RELATED PATENT APPLICATION

This application claims priority to commonly owned U.S. Provisional Patent Application Ser. No. 60/574,564; filed May 26, 2004; entitled "Automatic Clock Control," by Joseph Julicher, David L. Otten and Daniel William Butler; which is hereby incorporated by reference herein for all purposes.

TECHNICAL FIELD OF THE INVENTION

The present invention relates to digital systems, more particularly, to clock speed control in a digital system that is changeable based upon available supply voltage.

BACKGROUND OF THE RELATED TECHNOLOGY

Digital systems use clocks to drive or step operation of sequential and latching digital circuits, and information transfer over data buses of the digital system. The speed at which the digital circuits reliably operate is dependent upon the supply voltage to these digital circuits. Higher operating voltages allow faster clock speeds for operation of the digital circuits. However, there are digital systems that may be battery operated and must continue operation even when the battery voltage degrades. Also faster clock speeds cause the digital circuits to draw more power.

Universal serial bus (USB) devices are being used for many applications in digital systems. The universal compatibility of USB devices for many different types of digital devices that may be used in a variety of applications. However, these diverse applications impose a broad range of operating parameter capabilities required by the USB devices, e.g., computer operation at full voltage and power versus remote field operation using a battery voltage supply. The former benefits from high data throughput (fast clock speeds) and the latter benefits from low operating voltage and power consumption (slow clock speeds).

Therefore, there is a need for digital devices having USB interfaces that will operate over a wide range of supply voltages and power consumption.

SUMMARY OF THE INVENTION

The present invention overcomes the above-identified problems as well as other shortcomings and deficiencies of existing technologies by providing an apparatus, system and method for controlling clock speed based upon supply voltage of a digital device having universal serial bus (USB) interface capabilities (hereinafter "USB device"). Clock speed as used herein refers to the frequency of an oscillator used to generate the clock, the higher the frequency the faster the clock speed.

A USB device must run at a 48 MHz clock speed for maximum USB data transfer capabilities. At this clock speed a power supply of around four (4) volts or greater is required. However, there are numerous applications for a USB device where there is only a lower voltage supply available and a limited power capacity, e.g., low power data logging where the USB device would run from a battery for long periods of time. To save power, a lower voltage is required and the USB device must operate at a clock speed of much less than 48 MHz. However, if this USB device is also used with a base computer having sufficient voltage and power available, the ability to automatically switch between multiple clock speeds, e.g., fast, medium or slow, depending upon voltage and power available, is most advantageous. Because USB is a dynamic bus, the USB device can be removed at any time and the USB device must be capable of running at a slower clock speed when the supply voltage is reduced.

According to a specific exemplary embodiment of the present invention, reduction of the clock speed from 48 MHz may be accomplished by disabling a phase-locked-loop (PLL) frequency multiplier. If this PLL multiplier is disabled when the voltage drops, for example, below four (4) volts, the USB device can continue to operate at, for example, 12 MHz at this lower voltage. When the USB device is plugged back into a full supply voltage, e.g., USB hub, and the voltage increases back to five volts, the PLL multiplier will be re-enabled and a flag may be set to alert the USB operating software that full speed (48 MHz) clock operation is now available with the USB device.

It is contemplated and within the scope of the present invention that other clock multiplication values, e.g., using a PLL and/or a plurality of selectable clock oscillators may be controlled by voltage level sensing circuitry such that lower voltages will result in lower clock speeds and higher voltages will result in faster clock speeds.

A technical advantage of the present invention is that a USB device is operating within its clock frequency and voltage limits.

Another technical advantage is reliable and uninterrupted USB device operation over a wide range of operating voltages.

Other technical advantages should be apparent to one of ordinary skill in the art in view of what has been disclosed herein.

BRIEF DESCRIPTION OF THE DRAWINGS

A more complete understanding of the present disclosure and advantages thereof may be acquired by referring to the following description taken in conjunction with the accompanying drawings wherein.

Figure 1:
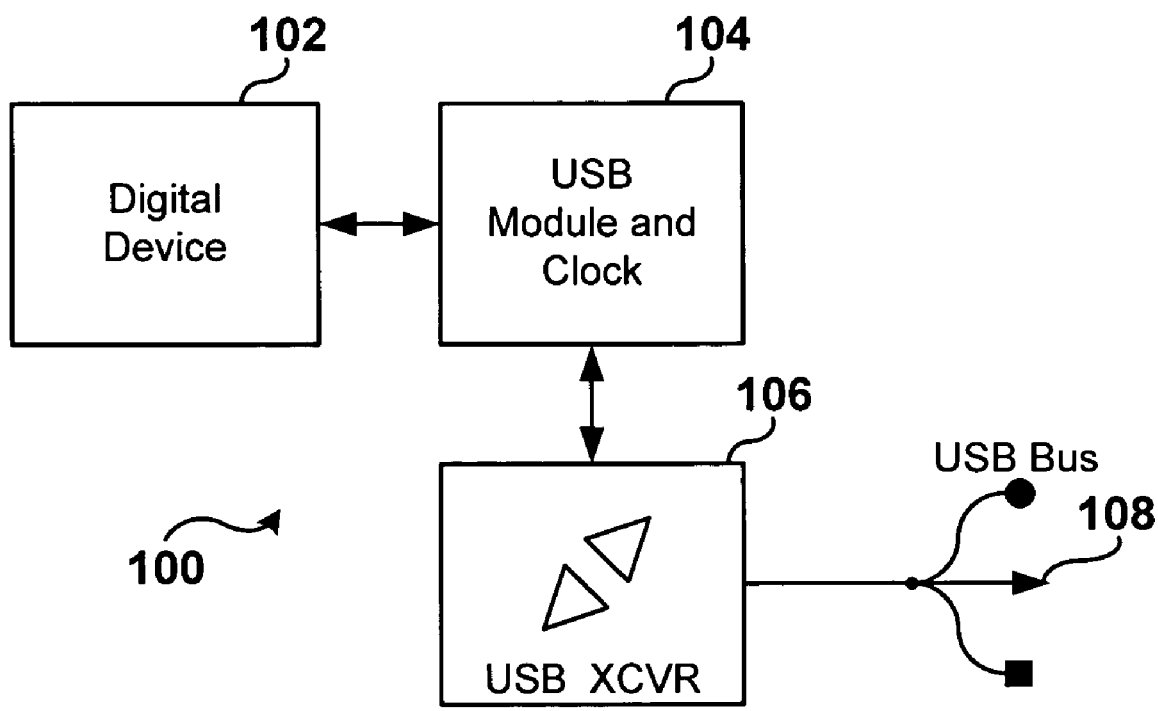
FIG. 1 is a schematic block diagram of a digital system having a USB port for connection to a USB device.

The present invention may be susceptible to various modifications and alternative forms. Specific embodiments of the present invention are shown by way of example in the drawings and are described herein in detail. It should be understood, however, that the description set forth herein of specific embodiments is not intended to limit the present invention to the particular forms disclosed. Rather, all modifications, alternatives, and equivalents falling within the spirit and scope of the invention as defined by the appended claims are intended to be covered.

DETAILED DESCRIPTION OF SPECIFIC EMBODIMENTS

Referring now to the drawings, the details of exemplary embodiments of the present invention are schematically illustrated. Like elements in the drawings will be represented by like numbers, and similar elements will be represented by like numbers with a different lower case letter suffix.

Clock speed as used herein refers to the frequency of an oscillator used to generate the clock, the higher the frequency the faster the clock speed.

Referring to FIG. 1, depicted is a schematic block diagram of a digital system having a USB port for connection to a USB device. The digital system, generally represented by the numeral 100, comprises a digital device 102, a USB module and clock 104, an USB transceiver 106 connected to a USB bus 108. The digital device 102 may be, for example but not limited to, a digital processor, microprocessor, microcontroller, digital signal processor (DSP), application specific integrated circuit (ASIC), programmable logic array (PLA), and the like. The USB module and clock 104 has a USB clock whose speed is controllable based upon the system voltage.

Figure 2:
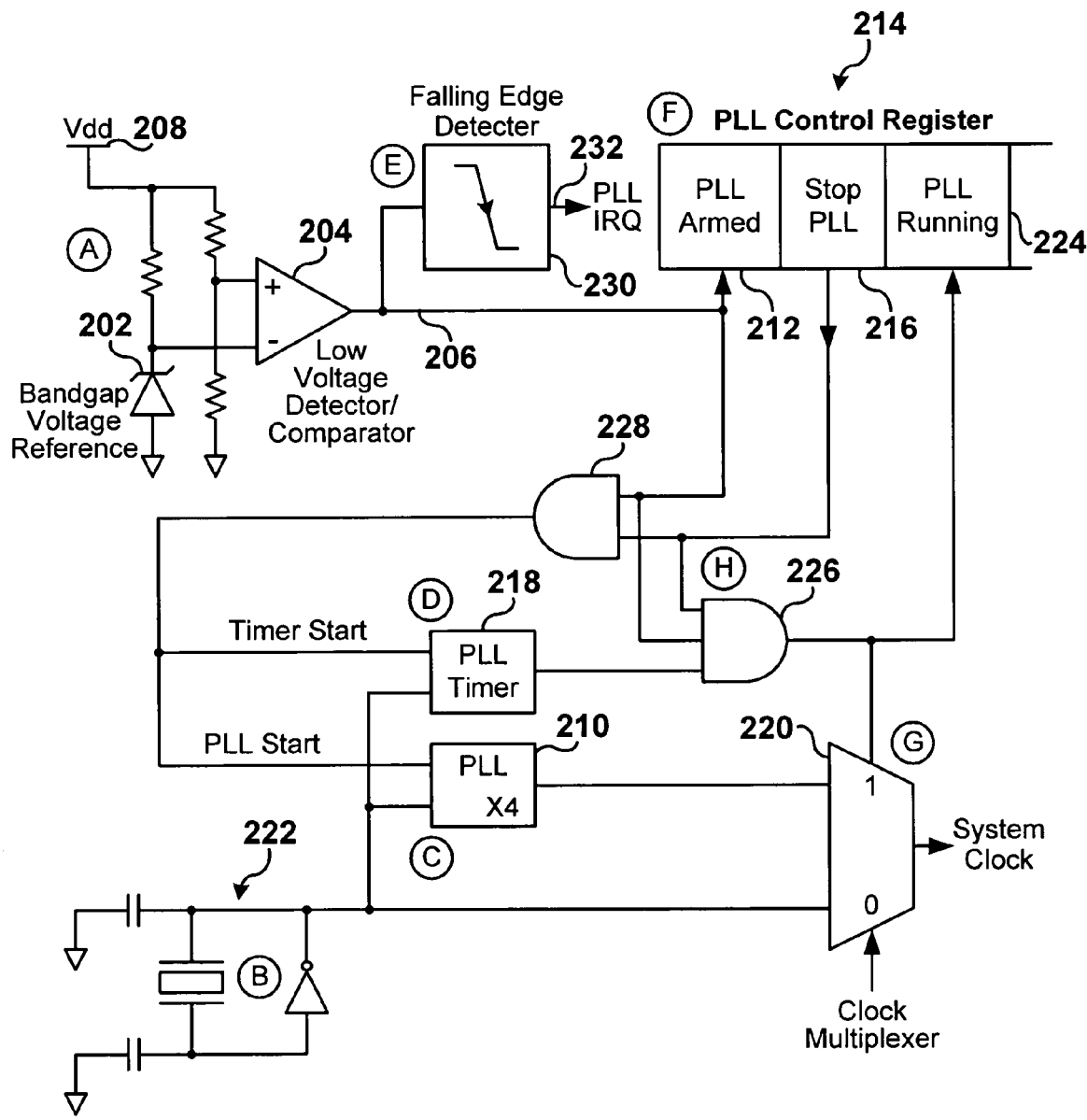
FIG. 2 is a schematic diagram of a USB clock circuit having clock speed controlled by supply voltage, according to a specific exemplary embodiment of the present invention.

Referring to FIG. 2, depicted is a schematic diagram of a USB clock circuit having clock speed controlled by supply voltage, according to a specific exemplary embodiment of the present invention. The USB clock circuit, generally represented by the numeral 200, may be part of the USB module and clock 104 (FIG. 1). A bandgap voltage reference 202 is used in combination with a voltage comparator 202 that provides a signal 206 when the operating voltage (Vdd) 208 is at a high enough voltage to properly enable a PLL 210. The signal 206 is adapted to set a PLL Armed bit 212 in a PLL control register 214. The digital system 100 then sets a Start PLL bit 216 in the PLL control register 214. When the PLL Armed bit 212 and Start PLL bit 216 are both active, a PLL timer 218 and the PLL 210 are started. The PLL timer 218 counts to an appropriate value to allow time for the PLL 210 to become stable. When the PLL timer 218 reaches its predetermined time (becomes active) its output goes high. When the PLL timer 218 is active (output high), and the PLL Armed bit 212 and the Start PLL bit 216 are both active (outputs high) an AND gate 226 causes a clock multiplexer 220 to switch from the oscillator 222 output to the PLL 210 output which is at a higher multiple frequency of the oscillator 222. A PLL Running bit 224 is also set when the multiplexer 220 switches from the oscillator 222 to the PLL 210. Thus when the multiplexer 220 switches from the oscillator 222 to the PLL 210, the high frequency output of the PLL 210 becomes the system clock.

When the operating voltage Vdd 208 begins to fall below the reference voltage of the bandgap voltage reference 202, the comparator 204 output signal 206 goes low. This will disable the PLL armed bit 212 and through the two AND gates 226 and 228, the clock multiplexer 220 will switch to the lower frequency oscillator 222 as the system clock. When the comparator 204 output signal 206 goes low, a falling edge detector 230 will send an interrupt signal (PLL IRQ) 232 that will signal an interrupt to the operating system software of the digital system 100. The operating system software can determine the new USB system clock speed by consulting the state of the bits in the PLL control register 214. The PLL Armed bit 212 and the PLL Running bit 224 will both be low. The software can then take appropriate action to reconfigure the digital system for low speed USB operation.

Further power savings may be realized by setting additional voltage detection comparators at additional different voltage thresholds. Each additional voltage threshold can be used to enable alternate clock sources or frequency dividers as would be appropriate for the available operating voltage Vdd.

The present invention has been described in terms of specific exemplary embodiments. In accordance with the present invention, the parameters for a system may be varied, typically with a design engineer specifying and selecting them for the desired application. Further, it is contemplated that other embodiments, which may be devised readily by persons of ordinary skill in the art based on the teachings set forth herein, may be within the scope of the invention, which is defined by the appended claims. The present invention may be modified and practiced in different but equivalent manners that will be apparent to those skilled in the art and having the benefit of the teachings set forth herein.

What is claimed is:

1. A digital system having selectable clock speed based upon available supply voltage, said digital system comprising:
   a clock oscillator at a first frequency;
   a phase-locked-loop (PLL) having a PLL oscillator at a second frequency, wherein the second frequency is a multiple of the first frequency;
   a voltage comparator having an input coupled to a supply voltage, and an output that is at a first logic level when the supply voltage is greater than a reference voltage and is at a second logic level when the supply voltage is less than or equal to the reference voltage;
   a clock multiplexer having a first input coupled to the PLL oscillator, a second input coupled to the clock oscillator and an output of either the clock oscillator or the PLL oscillator wherein selection thereof is controlled by the voltage comparator output such that when the voltage comparator output is at the first logic level the PLL oscillator is coupled to the clock multiplexer output and when the voltage comparator output is at the second logic level the clock oscillator is coupled to the clock multiplexer output;
   a PLL control register having
      a PLL armed bit that indicates when the voltage comparator output is at the first logic level;
      a PLL start bit that controls when the PLL timer and PLL oscillator start; and
      a PLL running bit that indicates when the output of the clock multiplexer is coupled to the PLL oscillator; and
   a digital device coupled to PLL control register, wherein the digital device reads from and writes to the PLL control register.

2. The digital system according to claim 1, further comprising a bandgap voltage reference in combination with the voltage comparator.

3. The digital system according to claim 1, further comprising a timer for delaying output selection in the clock multiplexer until the PLL oscillator is stable.

4. The digital system according to claim 1, further comprising a logic level change detector for detecting when the voltage comparator output goes from the first logic level to the second logic level.

5. The digital system according to claim 4, wherein the first logic level is a high logic level and the second logic level is a low logic level, and the logic level change detector is a falling edge detector.

6. The digital system according to claim 4, wherein the logic level change detector generates an interrupt to the digital device when detecting the logic level change.

7. The digital system according to claim 1, wherein the second frequency is an integer multiple of the first frequency.

8. The digital system according to claim 1, wherein the second frequency is four times the first frequency.

9. The digital system according to claim 1, wherein the digital device is selected from the group consisting of a digital processor, microprocessor, microcontroller, digital signal processor (DSP), application specific integrated circuit (ASIC) and programmable logic array (PLA).

10. The digital system according to claim 1, wherein the clock multiplexer output is coupled to a universal serial bus (USB) interface.

11. The digital system according to claim 1, wherein the reference voltage is about four volts.

* * * * *